(12) United States Patent
Peron

(10) Patent No.: US 11,387,653 B2
(45) Date of Patent: Jul. 12, 2022

(54) DEVICE AND METHOD FOR TESTING POWER MODULES

(71) Applicant: GE Energy Power Conversion Technology Ltd, Rugby (GB)

(72) Inventor: Regis Peron, Vertou (FR)

(73) Assignee: GE ENERGY POWER CONVERSION TECHNOLOGY LIMITED, Rugby (GB)

(*) Notice: Subject to any disclaimer, the term of this patent is extended or adjusted under 35 U.S.C. 154(b) by 134 days.

(21) Appl. No.: 16/118,784

(22) Filed: Aug. 31, 2018

(65) Prior Publication Data

US 2019/0097426 A1 Mar. 28, 2019

(30) Foreign Application Priority Data

Sep. 26, 2017 (FR) ...................................... 1758894

(51) Int. Cl.
| | |
|---|---|
| *H02J 3/18* | (2006.01) |
| *G01R 31/42* | (2006.01) |
| *F03D 17/00* | (2016.01) |
| *G01R 31/34* | (2020.01) |
| *G01R 21/00* | (2006.01) |
| *G05F 1/66* | (2006.01) |

(52) U.S. Cl.
CPC ............ *H02J 3/1892* (2013.01); *F03D 17/00* (2016.05); *G01R 21/003* (2013.01); *G01R 31/34* (2013.01); *G01R 31/42* (2013.01); *G01R 31/343* (2013.01); *G05F 1/66* (2013.01)

(58) Field of Classification Search
None
See application file for complete search history.

(56) References Cited

U.S. PATENT DOCUMENTS

| | | | |
|---|---|---|---|
| 7,042,110 B2* | 5/2006 | Mikhail | F03D 7/048 290/44 |
| 2009/0107256 A1* | 4/2009 | Jensen | G01M 5/005 73/862 |
| 2010/0025994 A1* | 2/2010 | Cardinal | H02J 3/381 290/44 |
| 2010/0332040 A1* | 12/2010 | Garcia | F03D 7/048 700/287 |
| 2011/0106470 A1* | 5/2011 | Yin | H02J 3/01 702/58 |
| 2012/0101643 A1* | 4/2012 | Kirchner | H02J 3/18 700/287 |
| 2012/0136494 A1* | 5/2012 | Kirchner | H02J 3/386 700/287 |
| 2014/0103726 A1* | 4/2014 | Martin | H02M 1/36 307/65 |
| 2014/0361537 A1* | 12/2014 | Andresen | F03D 9/257 290/44 |
| 2015/0249415 A1* | 9/2015 | Babazadeh | H02P 9/02 290/44 |

(Continued)

*Primary Examiner* — Lina M Cordero
(74) *Attorney, Agent, or Firm* — Wood IP LLC

(57) ABSTRACT

A device for testing a power module of a set of power modules connected together includes reactive power compensation means capable of compensating the reactive power transferred between a tested power module and the other power modules, and means for monitoring the power generated by the tested power module including means for comparing said generated power with at least one threshold value.

9 Claims, 5 Drawing Sheets

(56) References Cited

U.S. PATENT DOCUMENTS

| | | | |
|---|---|---|---|
| 2015/0275862 A1* | 10/2015 | Babazadeh | F03D 7/00 290/44 |
| 2015/0337808 A1* | 11/2015 | Kang | H02J 3/16 290/44 |
| 2015/0369217 A1* | 12/2015 | Gupta | H02H 7/093 290/44 |
| 2016/0169204 A1* | 6/2016 | Wang | F03D 7/00 290/44 |
| 2016/0245259 A1* | 8/2016 | Gupta | H02P 9/10 |
| 2016/0336888 A1* | 11/2016 | Busker | H02J 3/386 |
| 2017/0284359 A1* | 10/2017 | Burkle | F03B 13/12 |

* cited by examiner

DEVICE AND METHOD FOR TESTING POWER MODULES

BACKGROUND OF THE INVENTION

The invention concerns a device and a method for testing a set of electrical power modules, and more particularly a network of multiphase and multichannel synchronous electrical machines and their associated multichannel power converter.

For example, in a non-restrictive application, power modules are intended to be integrated into wind turbine nacelles.

Wind turbines incorporating the power module are connected to each other and to a power-consuming electricity grid, so as to create an offshore power generation field.

Before the power modules are put into production, it is necessary to check the electrical and mechanical characteristics of each module as well as the connections between the modules and connecting them to an electrical network.

The test procedure seeks to verify the operation of each power module, i.e. the operation of the control and acquisition chains including sensors, interfacing modules, actuators, the power chain, and also the connections between the power modules, and the connections between the power modules and an electrical network to which they are connected via a mesh of the power modules.

FIG. 1 shows an offshore wind farm (M) in which a state-of-the-art test procedure can be implemented.

H wind turbines are generally connected in groups G1, . . . , Gn of six wind turbines to an offshore S substation via C1, . . . , Cn submarine cables of large cross-section and long distance, for example 50 km.

Each H turbine comprises a power module comprising a multiphase and multichannel synchronous electrical machine and its associated multichannel power converter, and a turbine controller.

For example, a wind turbine H provides a rated electrical output of 6 MW.

Substation S includes a PT platform anchored to the seabed and located above sea level.

The S substation also comprises a G generator set with at least one diesel internal combustion engine and generally delivering 1 MW of electrical power, an L inductor bar and an MC wind turbine field controller.

The G generator set generates the electrical power required to operate the H wind turbines, particularly during the test phases.

The inductance bar L is connected to the C1, . . . , C2 cables in order to compensate the reactive power generated by the wind farm and transferred by the C1 and C2 cables and stabilize the electrical circuit.

A test procedure for a wind farm is known from the state of the art. During the test procedure, an Lt inductance bar and an R resistor bank are connected to the C1 and C2 cables to compensate reactive power and dissipate active power, respectively.

The test procedure for a Ha wind turbine will now be considered.

The individual phases of the test procedure are controlled by a wind turbine controller incorporated in the Ha wind turbine and the MC wind turbine field controller.

In a first phase, the Ha wind turbine is driven in rotation by the power delivered by the G generator set.

Then the blades of the Ha turbine are oriented so that they are driven by the wind and the Ha turbine delivers electrical power.

The power generated by the Ha wind turbine dissipated in the resistance bank R is compared with reference values.

However, the usual testing procedure has several drawbacks.

The test device first requires the use of an inductance bar and a resistor bench which will be removed at the end of the test procedure, before the conditioning station is connected to the network.

These elements are only used during the test procedure and require a storage space on the platform that will only be used during the test procedure, which generally lasts 6 months, whereas the duration of use of a wind turbine field is generally 25 years.

In addition, the test procedure is limited to a reduced operating power range, generally up to 20% of the rated power of the module.

The usual test procedure therefore does not allow the power module to be tested at its rated power.

BRIEF SUMMARY

In view of the above, it is proposed to overcome the disadvantages of power module procedures according to the state of the art.

It is therefore proposed, according to one aspect, a device for testing a module of a set of power modules connected together.

According to a realization mode, the device includes reactive power compensation means able to compensate the reactive power transferred between a tested power module and the other power modules, and power control means generated by the tested power module including means for comparing said generated power with at least one threshold value.

The reactive power compensation means are constituted by one of the power modules configured to compensate the reactive power exchanged with the tested power module.

Each power module comprises a multiphase and multichannel synchronous electrical machine having a stator comprising several groups of three phases with a magnetic coupling level allowing each channel to be controlled separately.

Each channel of the multiphase and multichannel synchronous electrical machine operates in motor or power generator mode.

The device may also include power generation means connected to the said power modules and capable of accelerating the module under test.

The means of energy production include a generator set including a diesel engine.

According to another method of realization, the means of energy production include an additional power module.

Depending on one aspect, the power modules as defined above are embedded in a wind turbine nacelle.

According to yet another aspect, it is proposed a test procedure of a set of power modules connected together.

According to an implementation mode, the reactive power transferred between a tested power module and the other power modules is compensated, the power generated by the tested power module is controlled, and said generated power is compared with at least one threshold value.

The process includes
a start-up phase during which the tested power module is supplied until it reaches the followed connection speed;
and a phase for controlling said power generated by the tested power module having a multiphase and multichannel synchronous electrical machine having a stator comprising phases connected together in groups of three phases and wherein the rotor of the electrical machine is driven via at least one group of three phases at a predetermined rotation speed, one or more other groups of three phases of said tested power module operating in generator mode and an electromagnetic torque is applied to the rotor of the multiphase and multichannel synchronous electrical machine of said tested power module.

BRIEF DESCRIPTION OF THE DRAWINGS

Other objectives, characteristics and advantages of the invention will become apparent on reading the following description, given solely by way of a non-limiting example, with reference to the accompanying drawings, in which.

DETAILED DESCRIPTION OF THE INVENTION

Figure 1:
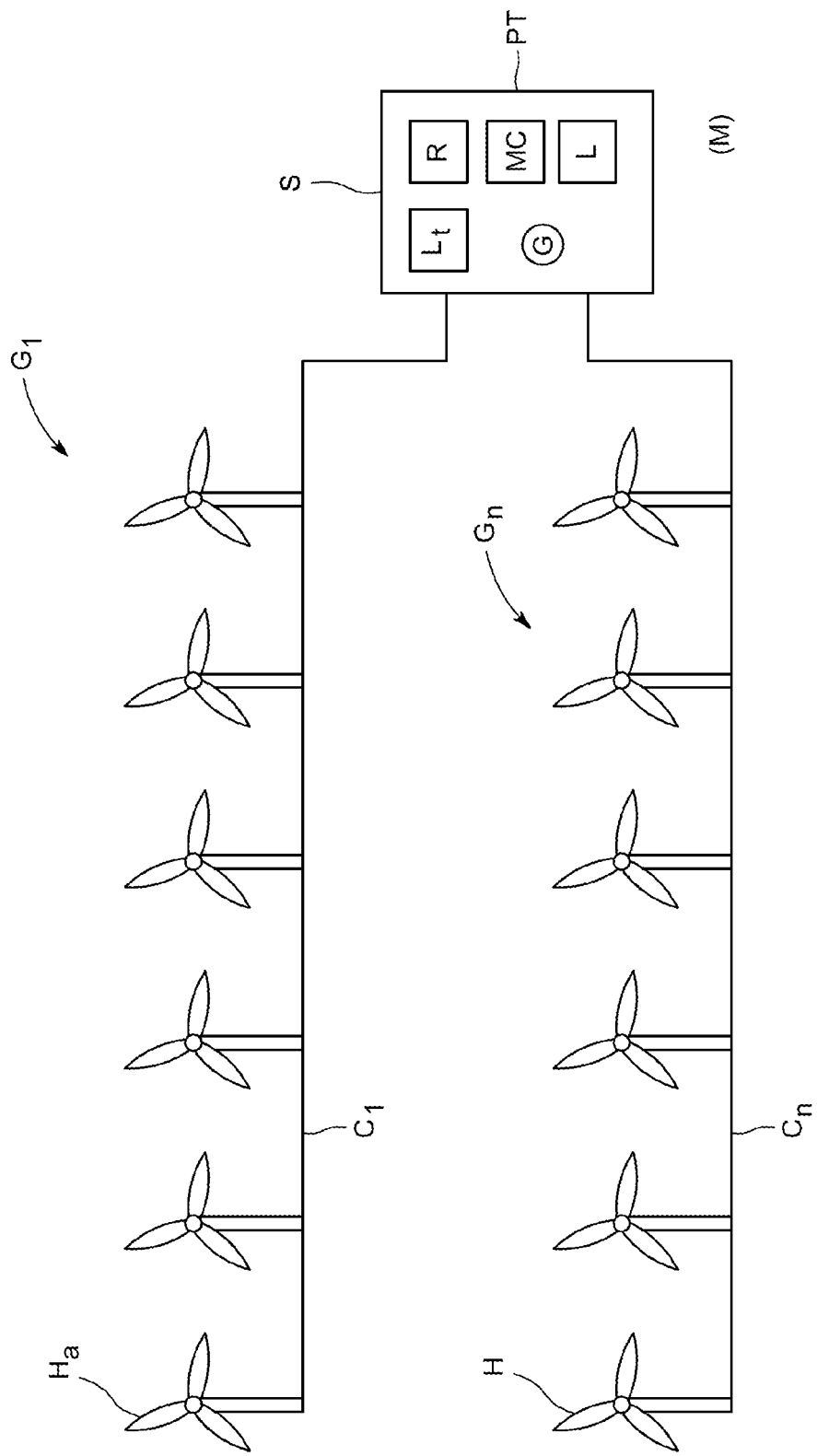
FIG. 1, which has already been mentioned, shows an offshore wind farm in which a state-of-the-art test procedure can be implemented.
Figure 2:
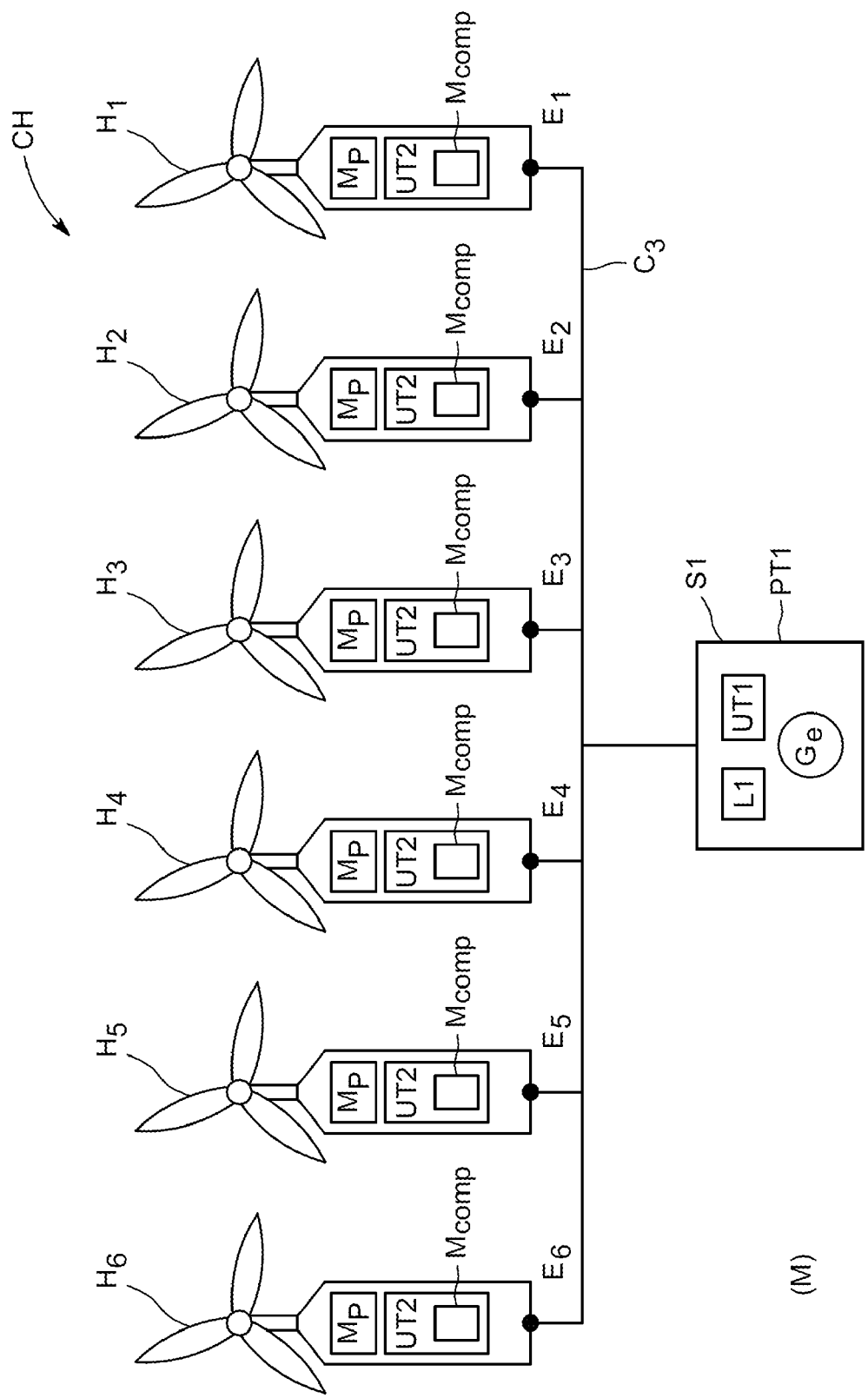
FIG. 2 shows an offshore wind farm implementing a test procedure according to the invention.

Refer to FIG. 2 which shows a test device for a set of Mp power modules connected together, each power module includes a multiphase and multichannel synchronous electrical machine and an associated multichannel power converter.

Here, Mp power modules are generator modules and power consumers.

For example, in a non-restrictive application, each Mp power module is integrated into the nacelle of a wind turbine.

Wind turbines form a CH field of offshore wind turbines (M).

To improve the clarity of the presentation, the wind turbine field as shown includes a set of six H1, H2, H3, H4, H5 and H6 variable blade wind turbines each comprising a connection terminal E1, E2, E3, E4, E5 and E6 for connection to a C3 cable, an Mp power module, and means for controlling the power generated by the power module including a UT2 power processing and control unit. The C3 cable connects the H1, H2, H3, H4, H5 and H6 wind turbines to each other and to an S1 substation with a PT1 platform anchored to the seabed and located above sea level (M).

Of course, the CH field of wind turbines can comprise several lots, each lot comprising several wind turbines, for example 6 wind turbines.

The wind turbines in the same batch are connected to each other and to the conditioning station by the same cable.

Substation S1 includes an L1 inductor, a UT1 wind turbine field processing and supervision unit and a Ge generator set installed on the PT platform.

The Ge generator set generates electrical power which supplies the S1 station and the H1, H2, H3, H4, H5 and H6 wind turbines via the C3 cable. For example, it includes at least one diesel internal combustion engine with an electrical output of 1 MW.

The L1 inductance stabilizes the electrical circuit including the wind turbines, the C3 cable and the S1 substation.

The H1, H2, H3, H4, H5 and H6 wind turbines are identical in construction.

The UT1 processing and supervision unit controls the CH wind turbine field by regulating power exchanges in the wind turbine field, in particular between the wind turbines and the S1 substation, and the UT2 processing and power control unit controls the wind turbine in which it is implemented.

In other words, the UT2 power processing and control unit controls the Mp power unit and the orientation of the wind turbine blades.

The two processing units UT1 and UT2 interact with each other.

For example, the UT1 and UT2 processing units are based on a microprocessor.

It can be any device capable of supervising a set of power modules.

In the example described, for example, it is a device capable of controlling a wind turbine power module and orienting the blades of a wind turbine. These may include micro controllers.

The device further comprises reactive power compensation means capable of compensating the reactive power transferred between a tested power module and the other power modules and means for comparing $M_{comp}$ of the power generated by the tested power module with at least one threshold value.

The $M_{comp}$ comparison means are incorporated in the UT2 processing unit of the wind turbine under test.

Of course, it can be any device able to compare the power generated by the power module tested with at least one threshold value and incorporated in the control means.

It can be a device made from a microprocessor.

Figure 3:
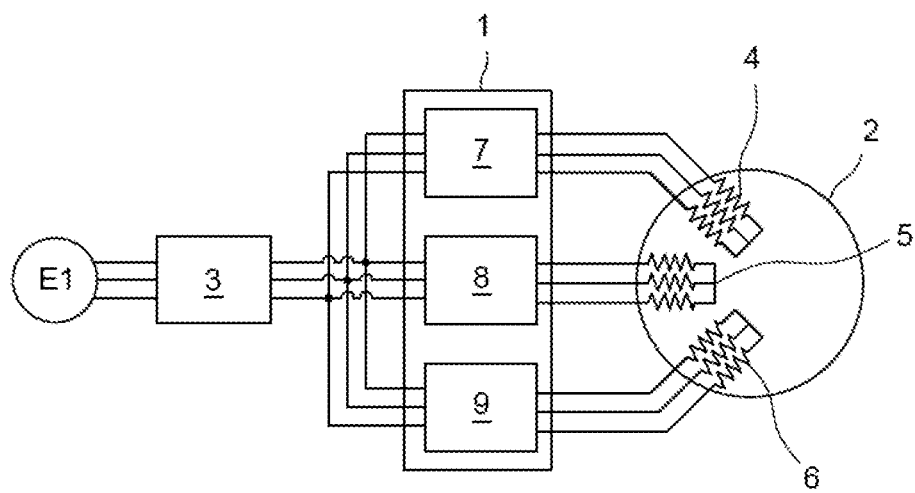
FIG. 3 shows an electrical power diagram of an electrical power module comprising a multiphase synchronous electrical machine and a multi-channel power converter.

Refer to FIG. 3 which illustrates the electrical power diagram of a H1 wind turbine nacelle.

A wind turbine nacelle comprises a three-phase transformer 3 connected to the E1 connector and an electrical power module comprising a 2 multiphase and multichannel electrical machine and a three-phase multichannel power converter 1.

The same phase inputs of the power converter 1 are connected to each other and to the corresponding output of the three-phase transformer 3.

The entire device comprising the power converter 1 and the multiphase and multichannel 2 electrical machine is controlled by the UT2 processing unit.

The synchronous multiphase and multichannel electrical machine 2 comprises of a stator and a rotor. The stator includes a plurality of phases that are multiples of three. The phases are connected to one another by groups of three phases. By way of a non-limiting example hereunder, the three phases of a group are connected in a star configuration. Of course, one does not leave the invention when the phases are connected in any configuration, in particular but not exclusively in triangle configuration. The stars have a strong magnetic decoupling between them. Therefore, magnetic fluxes generated by one star configuration do not disturb another star configuration. The magnetic decoupling level allows each channel to be controlled separately.

In FIG. 3, Machine 2 has, for example, nine phases grouped into three groups of 4, 5 and 6 star-connected triple phases.

The power converter 1 has a plurality of identically formed channels. Each output of a channel is connected to a group of triple phases in the star configuration of the electrical machine 2. Therefore, the number of channels of the power converter 1 is equal to the number of triple-phase groups in the star configuration of the machine 2. The inputs of the same-phase channels are connected to one another and to the corresponding output of the transformer 3.

In FIG. 3, the electrical machine has three groups 4, 5 and 6 of triple phases in star configuration. Therefore, the power converter 1 comprises three channels 7, 8, 9.

Figure 4:
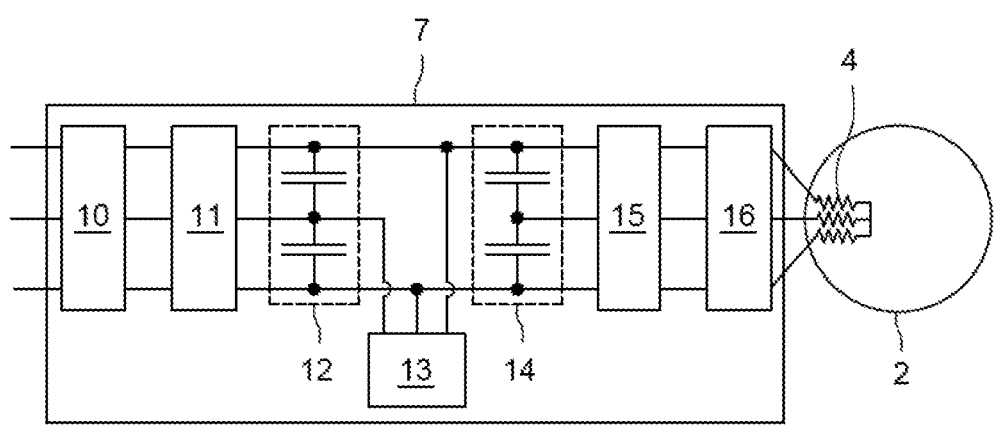
FIG. 4 shows a channel of the multichannel power converter.

Refer to FIG. 4 which shows the constitution of channel 7 of multichannel power converter 1 operating in motor or power generator mode. All channels are formed identically.

Channel 7 includes a harmonic filtering device 10 whose inputs are intended to be connected to transformer 3 and the other inputs of the power converter channel 1.

The outputs of the filter device 10 are connected to the inputs of a reversible controlled bridge rectifier 11.

The outputs of bridge rectifier 11 are connected to a capacitor bank 12.

The capacitor bank 12 comprises two groups of series-connected capacitors whose ends are connected to the bridge rectifier 11, to a brake chopper 13 and to the inputs of a reversible voltage inverter 15, and whose midpoint between the two capacitors is connected to the brake chopper. A second capacitor bank 14, identical to capacitor bank 12, is connected to the inputs of the reversible voltage inverter 15.

The middle point between the two capacitor groups of capacitor bank 14 is connected to the reversible voltage inverter 15. The outputs of the voltage inverter 15 are connected to a dV/dT filter 16. The outputs of the filter 16 are connected to a group of triple phases in the star configuration of the electrical machine 2.

The filtering device 10, the controlled and reversible bridge rectifier 11, the brake chopper 13, the reversible voltage inverter 15 and the dV/dT filter 16 are not discussed in detail here, since these elements are known to skilled technicians.

Figure 5:
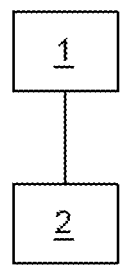
FIG. 5 describes a wind turbine field test procedure.

At present, a first mode of implementation of the wind turbine field test procedure shown in FIG. 2 is described in FIG. 5.

In this mode of implementation of the wind turbine field test procedure, one of the turbines is operated in reactive power compensation mode and the operation of another turbine is tested by controlling the power generated by the turbine.

In other words, the reactive power transferred between a tested power module and the other power modules is compensated, the power generated by the tested power module is controlled, and said generated power is compared with at least one threshold value.

In step 1, a first power module Mp incorporated in one of the wind turbines, in this case the H1 referenced wind turbine, and comprising the 2 multiphase and multichannel electrical machine and the 1 multichannel power converter, operates so as to compensate the reactive power generated by the CH wind field and transferred by the C3 cable. This mode of operation of the wind turbine is called CPR reactive power compensation mode.

A reactive power set point to be compensated is determined by the UT1 processing unit and transmitted to the UT2 processing unit of the H1 wind turbine which controls the H1 power module in such a way as to compensate the reactive power.

Then in step 2, the power module incorporated in the other H2 turbine is tested by controlling the power generated by the turbine.

Of course, the power module test procedure is identical for each module incorporated in one of the H1, H2, H3, H4, H5 and H6 wind turbines.

In other words, the reactive power compensation means are constituted by the power module Mp incorporated in the H1 referenced wind turbine configured to compensate the reactive power exchanged with the tested H2 power module.

The wind turbine operating in reactive power compensation mode is any of the H1, H2, H3, H4, H5 and H6 wind turbines excluding the wind turbine under test.

In the case of a wind farm with several batches, at least one wind turbine per batch shall operate in CPR reactive power compensation mode throughout the test procedure.

This procedure is repeated for each wind turbine in the wind farm.

The procedure can be performed for one wind turbine at a time, for several wind turbines at a time or for all the wind turbines in the field in one test operation.

The powers used will be adapted according to the number of wind turbines tested simultaneously.

In CPR mode, the coils of phase groups 4, 5 and 6 of the electrical machine 2 are used as inductors.

The reversible voltage inverter 15 adjusts the phase shift between the current flowing through each phase and the voltage at the terminals of each phase so as to compensate for reactive power in the grid.

The voltage inverter is controlled by the UT1 wind turbine field processing unit in such a way as to deliver a reactive power compensation set point.

No additional inductance bar is required to perform the wind turbine field test procedure.

Figure 6:
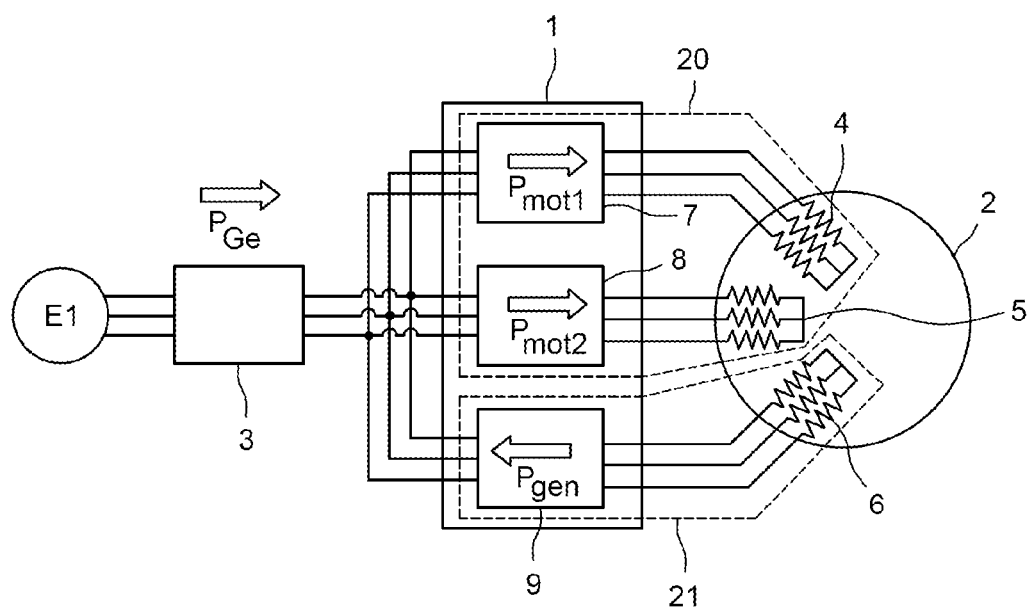
FIG. 6 shows the electrical power exchanges of the test process according to the invention.

FIG. 6 shows the electrical power exchange flows of a star assembly and associated voltage inverter incorporated in the H2 wind turbine.

As shown in this figure, a $P_{Ge}$ power is transmitted by transformer 3 and supplies the power converter 1.

Phase groups 4 and 5 of machine 2 are supplied by motor powers $P_{mot1}$ and $P_{mot2}$ supplied by power converter 1, and phase group 6 generates a power $P_{gen}$ which supplies converter 1.

The test procedure is repeated for each group of triple phases or for a plurality of groups of triple phases in the star configuration of the electrical machine 2 and the associated channel(s) of the power converter 1 being tested.

Figure 7:
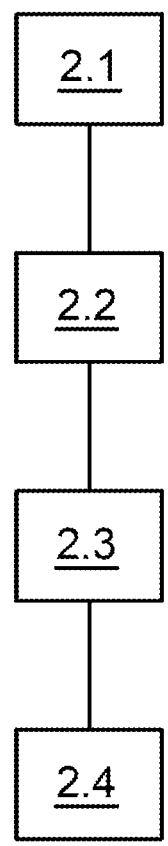
FIG. 7 describes a test procedure for a wind turbine nacelle power module.

FIG. 7 details the procedure for testing a power module of a wind turbine nacelle, previously described in step 2 of FIG. 5, and, in particular, the set 21 visible in FIG. 6 which includes the triple phase group in star configuration 6 and channel 9 of power converter 1.

The rotor of the electrical machine 2 is set in motion by the assembly 20 which comprises the triple phases 4 and 5 in star configuration fed by channels 7 and 8 of the power converter 1.

During step 2.1 of starting the test procedure, the 20 assembly is powered by power generation means capable of accelerating the power module under test until it reaches the connection speed.

The connection speed corresponds to the rotational speed from which the electrical machine and the power converter would produce sufficient power to supply an electrical network if they were operating in generator mode. In the case of a wind turbine, for example, the connection speed is 3.7 rpm.

The power generation means include the Ge generator set of substation S1 via transformer 3 connected to terminal E1.

The $P_{Ge}$ electrical power supplied by the Ge generator set is transmitted to the H2 wind turbine via the C3 cable.

The electrical power transfer is controlled by the UT1 wind turbine field processing unit in power regulation mode and by the UT2 wind turbine processing unit of the H2 wind turbine.

Triple phase groups 4 and 5 in star configuration are called motor groups.

The number of triple-phase motor groups, in star configuration, is chosen in such a way that the total rated drive power delivered by the stars is at least equal to the rated power of the tested set.

The electrical machine 2 is speed controlled by the UT2 processing unit of the tested H2 wind turbine.

In step 2.2, when the rotor of the electrical machine 2 reaches the connection speed, and after synchronization of the assembly 21, the tested assembly 21 is controlled so that it operates in power generator mode.

Set 21 controls the torque of the electrical machine 2.

The electrical power $P_{gen}$ generated by the assembly 21 is transferred to the motor assembly 20.

The processing unit UT2 of the wind turbine controls the set 21 and orients the blades of the wind turbine H2 so that the sum of the motor powers $P_{mot1}$ and $P_{mot2}$ consumed by the set 20 is equal to the power $P_{gen}$.

In step 2.3, when the sum of the motor powers $P_{mot1}$ and $P_{mot2}$ consumed by the set 20 is equal to the power $P_{gen}$, the power control phase generated by the tested power module starts.

The Ge generator set no longer supplies electrical power to the H2 wind turbine.

The H2 wind turbine is now autonomous and controlled by the UT2 processing unit.

The resistive electromagnetic torque generated by the assembly 21 comprising a group of triple phases in a star configuration 6 and the channel 9 of the associated power converter 1 applied to the rotor of the electrical machine 2 is increased gradually. As a result, the rotational speed of the rotor decreases. The UT2 process unit increases the drive power delivered by the 20 unit until the speed set point is reached. The resistive torque can thus be increased until the power generated by the resistive torque is equal to the motor power generated by the assembly 20.

The power generated by the assembly 21 is compared to the expected values in order to validate the operation of the assembly 21 by means of comparing $M_{comp}$.

This test procedure has the advantage of testing the power module over its entire power range by using the module's acquisition, control and power chains, for example in the case of a wind turbine.

The test device has an architecture to ensure active power exchanges within the power module.

In other words, during the second test phase, the power module operates autonomously by no longer exchanging active power with the wind turbine field.

Therefore, no resistance test bench is required to perform the test procedure and the power consumption of the generator set is reduced.

The packaging station's platform is small compared to the known state of the technology.

According to another method of implementing the test procedure, the means of energy production include an additional power module operating in generator mode incorporated for example in a wind turbine.

These means of production replace the Ge generator set.

The wind turbine operates in generator mode and supplies electrical power to the wind turbine under test.

The test procedure is identical to that described in the previous implementation mode.

In this implementation mode, the wind field controller operates in voltage regulation mode and the wind generator controller operates in power regulation mode by exporting power to the grid.

In other words, the power required during the start-up phase of the test procedure is generated by the wind. Therefore, the fuel consumption of the generator set is zero.

I claim:

1. A device for testing a power module of a set of power modules connected together, each power module being a generator module, the device comprising:
    a plurality of reactive power compensation units, each reactive power compensation unit disposed in each power module of the set of power modules, wherein each power module is operable in a reactive power compensation mode excluding a power module under test, and each reactive power compensation unit being configured to compensate a reactive power transferred between the power module under test and other power modules of the set of power modules, and
    a plurality of control units, each control unit being disposed adjacent to each power module and configured to control power generated by the power module, wherein each control unit comprises a comparator unit configured to compare said power generated by the power module under test with at least one threshold value.

2. The device according to claim 1, wherein each power module comprises a multiphase and multichannel synchronous electrical machine having a stator comprising a plurality of groups of three phases with a magnetic coupling level, allowing each channel to be controlled separately.

3. The device according to claim 2, wherein each channel of the multiphase and multichannel synchronous electrical machine operates in a motor or power generator mode.

4. The device according to claim 1, further comprising a power generating unit connected to said set of power modules and configured to increase a speed of the power module for supplying power in a power generator mode.

5. The device according to claim 4, wherein the power generating unit comprises a generator set comprising a diesel engine.

6. The device according to claim 4, wherein the power generating unit comprises an additional power module.

7. The device according to claim 1, wherein each power module of the set of power modules is embedded in a wind turbine nacelle.

8. A method for testing a power module of a set of connected power modules, wherein the method comprises:
    compensating, via a reactive power compensation unit of a plurality of reactive power compensation units, disposed within each power module of the set of connected power modules, each power module being operable in a reactive power compensation mode excluding a power module under test, a reactive power transferred between the power module under test and other power modules of the set of connected power modules,
    controlling, via a control unit of a plurality of control units, being disposed adjacent to each power module, power generated by the power module and comparing, via a comparator unit of the control unit said power generated by the power module under test with at least one threshold value.

9. The method according to claim 8, comprising:

a start-up phase during which the power module is powered until the power module reaches a connection speed for supplying power in a power generator mode; and a phase for controlling said power generated by the power module, wherein the power module comprises a multiphase and multichannel synchronous electrical machine comprising a stator comprising phases connected together by groups of three phases, and in which a rotor of the multiphase and multichannel synchronous electrical machine is driven via at least one group of three phases at a predetermined rotation speed, one or more other groups of three phases of said power module is operated in the power generator mode, and an electromagnetic torque is applied to the rotor of the multiphase and multichannel synchronous electrical machine of said power module.

\* \* \* \* \*